(12) United States Patent
Huang

(10) Patent No.: US 10,317,738 B2
(45) Date of Patent: Jun. 11, 2019

(54) ARRAY SUBSTRATE AND A DISPLAY PANEL

(71) Applicant: HKC Corporation Limited, Shenzhen, Guandgong (CN)

(72) Inventor: Beizhou Huang, Shenzhen (CN)

(73) Assignee: HKC CORPORATION LIMITED, Shenzhen, Guangdong (CN)

(*) Notice: Subject to any disclaimer, the term of this patent is extended or adjusted under 35 U.S.C. 154(b) by 0 days.

(21) Appl. No.: 15/743,249

(22) PCT Filed: Dec. 21, 2017

(86) PCT No.: PCT/CN2017/117657
§ 371 (c)(1),
(2) Date: Jan. 9, 2018

(65) Prior Publication Data
US 2019/0137805 A1 May 9, 2019

(30) Foreign Application Priority Data
Nov. 3, 2017 (CN) .......................... 2017 1 1071351

(51) Int. Cl.
| | |
|---|---|
| *H01L 29/04* | (2006.01) |
| *H01L 31/036* | (2006.01) |
| *G02F 1/1339* | (2006.01) |
| *H01L 27/12* | (2006.01) |
| *G02F 1/1368* | (2006.01) |
| *G02F 1/1337* | (2006.01) |

(52) U.S. Cl.
CPC ........ *G02F 1/13394* (2013.01); *G02F 1/1339* (2013.01); *G02F 1/1368* (2013.01); *G02F 1/133723* (2013.01); *H01L 27/1214* (2013.01)

(58) Field of Classification Search
CPC ............ H01L 27/1214; G02F 1/13394; G02F 1/133723; G02F 1/1368
USPC .......................................................... 257/72
See application file for complete search history.

(56) References Cited

U.S. PATENT DOCUMENTS

| | | | |
|---|---|---|---|
| 2015/0168752 A1* | 6/2015 | Shih ...................... | G02F 1/1337 349/123 |
| 2016/0246106 A1* | 8/2016 | Ma ......................... | G02F 1/1339 |
| 2016/0284766 A1* | 9/2016 | Wang .................. | H01L 27/3218 |
| 2016/0341992 A1* | 11/2016 | Lee .................... | G02F 1/133305 |

\* cited by examiner

*Primary Examiner* — David S Blum
(74) *Attorney, Agent, or Firm* — Muncy, Geissler, Olds & Lowe, P.C.

(57) ABSTRACT

A display panel comprises an array substrate, an opposing substrate, a liquid crystal layer and a sealing member. An array substrate comprises a substrate, a switch array structure formed on the substrate, a retaining wall structure disposed on the peripheral region of the substrate and substantially surrounding the switch array structure, and a flow guiding structure disposed on an area surrounding the peripheral region between the switch array structure and the retaining wall structure and having a height different from a height of the retaining wall structure. The opposing substrate is disposed opposing to the array substrate, and the liquid crystal layer is interposed between the array substrate and the opposing substrate, and the sealing member is disposed on the array substrate corresponding to the location surrounding the periphery of the liquid crystal layer and seals the array substrate and the opposing substrate.

20 Claims, 5 Drawing Sheets

ARRAY SUBSTRATE AND A DISPLAY PANEL

FIELD OF THE INVENTION

The present application relates to an array substrate and a display panel, and more particularly to an array substrate having a retaining structure and a liquid crystal display panel.

BACKGROUND OF THE INVENTION

In recent years, with the progress of science and technology, the liquid crystal display has the advantages of power saving, no radiation, small size, low power consumption, flat right angle, high resolution, stable image quality and the like, and is especially suitable for various types of information products such as: a Mobile phone, a notebook computer, a digital cameras, a PDA, a liquid crystal display screen and the like are more and more popular, so that the demand of the liquid crystal display (LCD) is greatly increased.

At present, the liquid crystal displays widely used are generally provided with two substrates and a liquid crystal layer is interposed between the two substrates, and a sealing member is positioned between the two substrates in the peripheral region so as to bond the two substrates together, and the liquid crystal layer is hermetically sealed between the two substrates.

In order to enable liquid crystal molecules between two substrates to form a certain pre-tilt orientation, an alignment layer or an orientation layer needs to be formed on the surfaces of the two substrates respectively. In general, the alignment layer further includes a rubbing step performed by rubbing the surface of the alignment layer with a rubbing roller to form the tiny groove for pre-tilt the liquid crystal molecules. After the formation of the alignment layer with the pre-tilt orientation groove is completed, the sealing member is used to bond the two substrates together.

In an existing display panel, a plurality of photo spaced retaining walls and a plurality of grooves are arranged in the peripheral area of the substrate so as to prevent the alignment layer forming solution (e.g., polyimide (PI) solution) from being coated on the non-effective display area of the color filter substrate, and are used to guide the overflowing of alignment layer forming solution flow back to the effective display area.

However, the design of the existing photo spaced retaining walls is mostly in parallel and with the same height, this design is likely to cause the poor fluidity of the alignment layer forming solution. And when the accumulation of the alignment layer forming solution is too large, a portion of photo spaced retaining walls will have the alignment layer forming solution residue. The residues may cause the cell gap of the display panel to be slightly higher in the peripheral region, and the display panel will have the border white, brightness uneven, residual and other bad phenomena as so called "mura".

In addition, in the four corners of the periphery of the sealing member bonded substrates there are no special designs for guiding the alignment layer forming solution, therefore there will be a case where the effluent is accumulating during the production process. Due to the four corners of the bonded substrates have the problem of the volume of the alignment layer forming solution accumulated increasingly, therefore the cell gap of the display panel near the four corners has problem prone to abnormal heighten.

SUMMARY OF THE INVENTION

In order to solve the aforementioned technical problem, it is an object of the present invention to provide an array substrate and a display panel without altering the existing production process to avoid the problem regarding the alignment layer forming solution accumulated in the plurality of dummy photo spaced walls causing by the poor fluidity, and thereby to avoid the problem of the cell gaps too height at the peripheral region of the switch array structure compared with the central part of that.

The purpose of the present invention and the aforementioned technical problem to be solved can be realized by the following technical embodiments.

According to the present invention, it provides an array substrate, the array substrate comprises a substrate, a switch array structure disposed on the substrate, a retaining wall structure disposed on a peripheral region of the substrate and surrounding the switch array structure, and a flow guiding structure disposed on an area surrounding the peripheral region between the switch array structure and the retaining wall structure. In addition, the flow guiding structure has a height different from a height of the retaining wall structure.

The purpose of the present invention and the aforementioned technical problem to be solved can be further realized by the following technical embodiments.

In one embodiment of the present invention, a groove is formed between the retaining wall structure and the switch array structure for the flow guiding structure to be disposed therein.

In one embodiment of the present invention, the flow guiding structure comprises a plurality of dummy photo spaced walls and a plurality of openings, and each of the plurality of dummy photo spaced walls and each of the plurality of openings are arranged in alternate.

In one embodiment of the present invention, the flow guiding structure comprises a plurality of dummy photo spaced walls, the regions adjacent to an included angle between two adjacent edges of the switch array structure without the dummy photo spaced walls disposed thereon.

In one embodiment of the present invention, the flow guiding structure comprises a plurality of dummy photo spaced walls, a width of each of the plurality of dummy photo spaced walls is substantially the same, or different, or partially the same, a height of each of the plurality of dummy photo spaced walls is substantially the same, or different, or partially the same, a thickness of each of the plurality of dummy photo spaced walls is substantially the same, or different, or partially the same, a plurality of openings is formed between the plurality of dummy photo spaced walls arranged in alternate, a width of each of the plurality of openings is substantially the same, or different, or partially the same.

In one embodiment of the present invention, the flow guiding structure comprises a plurality of dummy photo spaced walls, a cross sectional shape of each of the plurality of dummy photo spaced walls parallel to the substrate is a straight line segment, a semicircle, a semi-elliptical arc, a concave, a circle, an ellipse or any combination of the semi-elliptical arc, the concave, the circle and the ellipse.

In one embodiment of the present invention, the array substrate is a thin film transistor array substrate, the flow guiding structure is formed on the thin film transistor array substrate and composed of a metal thin film, an inorganic insulating film, a transparent conducting thin film, a semiconductor thin film, or a combination of one or some of the metal thin film, the inorganic insulating film, the transparent conducting thin film, and the semiconductor thin film.

In one embodiment of the present invention, the array substrate is a color filter substrate, the flow guiding structure is formed on the color filter substrate and composed of a color thin film, a protective thin film, a black matrix thin film, a transparent conductive thin film, or a combination of one or some of the color thin film, the protective thin film, the black matrix thin film, and the transparent conductive thin film.

In one embodiment of the present invention, the retaining wall structure is formed by the same material as one of a plurality of colored resist materials used in the color filter layer forming on the color filter substrate.

Another object of the present invention is to provide a display panel comprising an array substrate, an opposing substrate, a liquid crystal layer and a sealing member. The array substrate comprises a substrate, a switch array structure, a retaining wall structure and a flow guiding structure.

The switch array structure is formed on the substrate, the retaining wall structure is disposed on the peripheral region of the substrate and substantially surrounding the switch array structure, and the flow guiding structure is disposed on an area surrounding the peripheral region between the switch array structure and the retaining wall structure and having a height different from a height of the retaining wall structure. The opposing substrate is disposed opposing to the array substrate, the liquid crystal layer is interposed between the array substrate and the opposing substrate, and the sealing member is disposed on the array substrate corresponding to the location surrounding the periphery of liquid crystal layer and seals the array substrate and the opposing substrate.

In one embodiment of the present invention, a groove is formed between the retaining wall structure and the switch array structure for enabling the flow guiding structure to be disposed therein.

In one embodiment of the present invention, the flow guiding structure comprises a plurality of dummy photo spaced walls and a plurality of openings, and each of the plurality of dummy photo spaced walls and each of the plurality of openings are arranged in alternate.

In one embodiment of the present invention, the flow guiding structure comprises a plurality of dummy photo spaced walls, the regions adjacent to an included angle between two adjacent edges of the switch array structure without the dummy photo spaced walls disposed thereon.

In one embodiment of the present invention, the flow guiding structure comprises a plurality of dummy photo spaced walls, a width of each of the plurality of dummy photo spaced walls is substantially the same, or different, or partially the same, a height of each of the plurality of dummy photo spaced walls is substantially the same, or different, or partially the same, a thickness of each of the plurality of dummy photo spaced walls is substantially the same, or different, or partially the same, a plurality of openings is formed between the plurality of dummy photo spaced walls arranged in alternate, a width of each of the plurality of openings is substantially the same, or different, or partially the same.

In one embodiment of the present invention, the flow guiding structure comprises a plurality of dummy photo spaced walls, a cross sectional shape of each of the plurality of dummy photo spaced walls parallel to the substrate is a straight line segment, a semicircle, a semi-elliptical arc, a concave, a circle, an ellipse or any combination of the semi-elliptical arc, the concave, the circle and the ellipse.

In one embodiment of the present invention, the array substrate is a thin film transistor array substrate, the flow guiding structure is formed on the thin film transistor array substrate and composed of a metal thin film, an inorganic insulating film, a transparent conducting thin film, a semiconductor thin film, or a combination of one or some of the metal thin film, the inorganic insulating film, the transparent conducting thin film, and the semiconductor thin film.

In one embodiment of the present invention, the array substrate is a color filter substrate, the flow guiding structure is formed on the color filter substrate and composed of a color thin film, a protective thin film, a black matrix thin film, a transparent conductive thin film, or a combination of one or some of the color thin film, the protective thin film, the black matrix thin film, and the transparent conductive thin film.

In one embodiment of the present invention, the retaining wall structure is formed by the same material as one of a plurality of colored resist materials used in the color filter layer forming on the color filter substrate.

The present invention also provides another array substrate, the array substrate comprises a substrate, a switch array structure disposed on the substrate, a retaining wall structure disposed on a peripheral region of the substrate surrounding the switch array structure, and a flow guiding structure disposed on an area surrounding the peripheral region between the switch array structure and the retaining wall structure and having a height different from a height of the retaining wall structure.

Wherein a groove is formed between the retaining wall structure and the switch array structure for enabling the flow guiding structure to be disposed therein. The flow guiding structure comprises a plurality of dummy photo spaced walls and a plurality of openings, and each of the plurality of dummy photo spaced walls and each of the plurality of openings are arranged in alternate. The plurality of dummy photo spaced walls is disposed on the area surrounding the peripheral region between the switch array structure and the retaining wall structure other than the regions adjacent to an included angle between two adjacent edges of the switch array structure.

Under the consideration of substantially not to alter the existing production process, the structure design of the display panel of the present invention is possible to avoid the problem regarding accumulation of the alignment layer forming solution at the plurality of dummy photo spaced walls causing by the poor fluidity, and thereby to avoid the problem of the cell gaps too height at the peripheral region of the switch array structure compared with the central part of that. Furthermore, the technology provided by the invention can be used for manufacturing various types of liquid crystal display panel, and is high in applicability.

Various other objects, advantages and features of the present invention will become readily apparent from the ensuing detailed description, and the novel features will be particularly pointed out in the appended claims.

BRIEF DESCRIPTION OF FIGURES

The following detailed descriptions, given by way of example, and not intended to limit the present invention solely thereto, will be best be understood in conjunction with the accompanying figures.

DETAILED DESCRIPTION OF THE EMBODIMENTS

Figure 1:
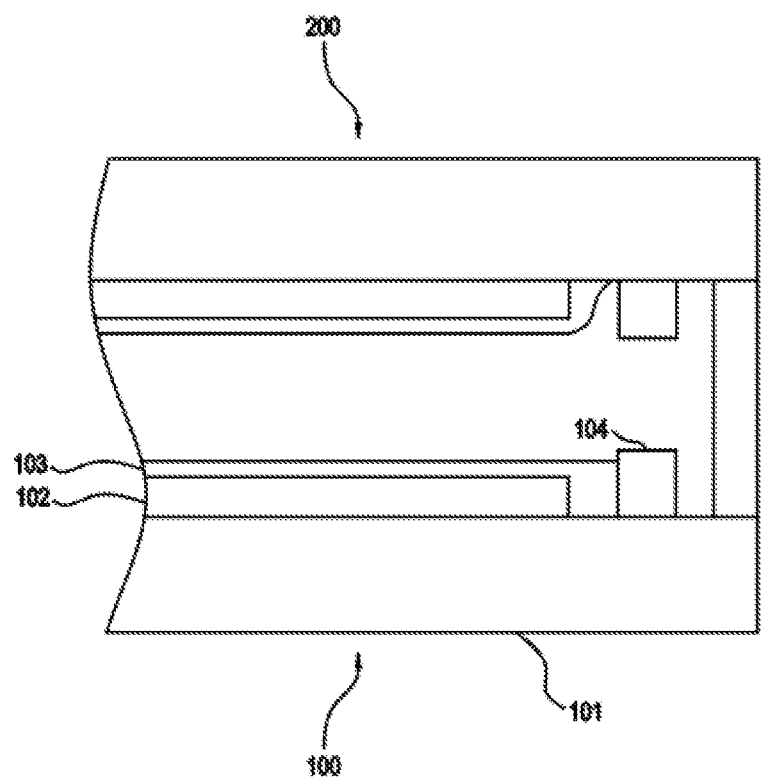
FIG. 1 is a schematic cross-sectional view of an exemplary liquid crystal display panel.

The following embodiments are referring to the accompanying drawings for exemplifying specific implementable embodiments of the present invention. Furthermore, directional terms described by the present invention, such as upper, lower, front, back, left, right, inner, outer, side and etc., are only directions by referring to the accompanying drawings, and thus the used directional terms are used to describe and understand the present invention, but the present invention is not limited thereto.

The drawings and description are to be regarded as illustrative in nature and not restrictive. Like reference numerals designate like elements throughout the specification. In addition, the size and thickness of each component shown in the drawings are arbitrarily shown for understanding and ease of description, but the present invention is not limited thereto.

In the drawings, the thickness of layers, films, panels, regions, etc., are exaggerated for clarity. In the drawings, for understanding and ease of description, the thicknesses of some layers and areas are exaggerated. It will be understood that, when an element such as a layer, film, region, or substrate is referred to as being "on" another element, it can be directly on the other element or intervening elements may also be present.

Furthermore, in the specification, "on" implies being positioned above or below a target element and does not imply being necessarily positioned on the top on the basis of a gravity direction.

For further explaining the technical means and efficacy of the present application intended to file, an array substrate and a display panel including the embodiments, structures, features and effects thereof according to the present invention will be apparent from the following detailed description and accompanying drawings.

A liquid crystal display panel of the present invention comprises a first substrate, a second substrate and a liquid crystal layer disposed between the first substrate and the second substrate. The first substrate and the second substrate may be, for example, a thin film transistor array substrate, color filter layer substrate. It is not limited thereto, in some embodiments, the thin film transistor array and the color filter layer of the present invention can also be formed on the same substrate.

In some embodiments, the liquid crystal panel of the present invention may be a curved display panel.

FIG. 1 is a schematic cross-sectional view of an exemplary liquid crystal display panel. The basic structure of the liquid crystal display panel comprises an array substrate 100, an opposing substrate 200, a sealing member and a liquid crystal layer. The array substrate 100 comprises a substrate 101, a switch array structure 102 formed on the substrate 101, an alignment layer 103 formed on the switch array structure 102, and a retaining wall structure 104 disposed on the peripheral region of the substrate 101 and substantially surrounding the alignment layer 103. In addition, a height of difference is formed between the top end of the retaining wall structure 104 and a surface of the substrate 101.

As shown in FIG. 1, a forming solution containing the material such as polyimide (PI) for the alignment layer 103 may be coated on the switch array structure 102 by an ink jetting process or a rolling process to form the alignment layer. The retaining wall structure 104 generally includes a plurality of different structures such as a groove, a dummy photo spaced walls forming by photo spacers, or a non-display area colored resist blocking wall. The retaining wall structure 104 can be designed by at least one or a combination of one or some of the groove, the dummy photo spaced walls forming by photo spacers, and the non-display area colored resist blocking wall according to fabricating process requirements or product requirements.

Referring to FIG. 1, an effective display area is formed in the central part of the array substrate 100, and comprises a plurality of pixel areas, each pixel area is provided with a plurality of colored resist materials according to the specification of the display panel. For example, each pixel area is formed with three or four different colored resist materials, or even more colors. The three colored resist materials may be composed of red colored resist material, green colored resist material and blue colored resist material. The four colored resist materials may be composed of red colored resist material, green colored resist material, blue colored resist material and white colored resist material. The combination of the colored resist materials can also comprise colored resist of yellow or other colors.

The materials for the non-display area colored resist blocking wall may be composed of red colored resist material, green colored resist material and blue colored resist material. According to design requirements, a plurality of layers of the dummy photo spaced walls can be formed on the non-display area colored resist blocking wall. The dummy photo spaced walls or the non-display area colored resist blocking wall can be formed simultaneous with the photolithography processes of forming the red colored resist material, the blue colored resist material or the green colored resist material of the color filter layer, depending on the process requirements and the mask design.

The height of the dummy photo spaced walls and the width of the groove are designed to take into account the part of the over spouting of the alignment layer forming solution due to the tolerance and the accuracy of the machine. The laying size of the dummy photo spaced walls and the groove is accurately defined through calculation, so that an alignment layer forming solution is prevented from being coated on the effective display area of the array substrate. Furthermore, the part of the alignment layer forming solution applied to the periphery of the array substrate will be flows back into the effective display area through the employment of the dummy photo spaced walls and the groove.

In general design, each of the dummy photo spaced walls is designed to be the same height, and each groove is designed to be the same width, but in some necessity, the dummy photo spaced walls can be designed to be different in height.

In order to prevent the alignment layer forming solution overflow from being formed in the alignment layer, a plurality of dummy photo spaced walls are densely arranged on the peripheral region near to the included angle of two adjacent edges of the outer side of the switch array structure 102.

As described above, only one of the structures of the liquid crystal display panel is described as an example, but the scope of application of the present application is not limited thereto, and it can be applied to various types of liquid crystal display panels.

Figure 2A:
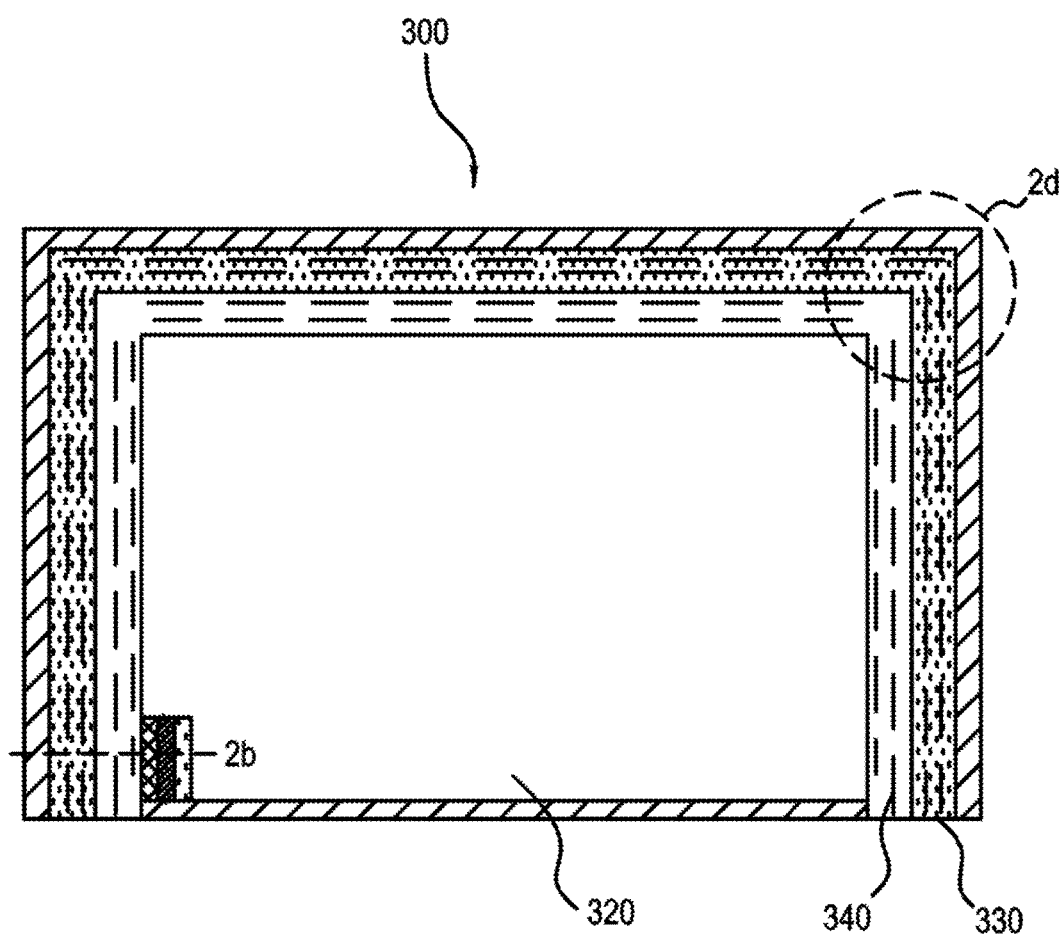
FIG. 2a is a top view showing a retaining wall structure and a flow guiding structure of an array substrate according to an embodiment of the present invention.
Figure 2B:
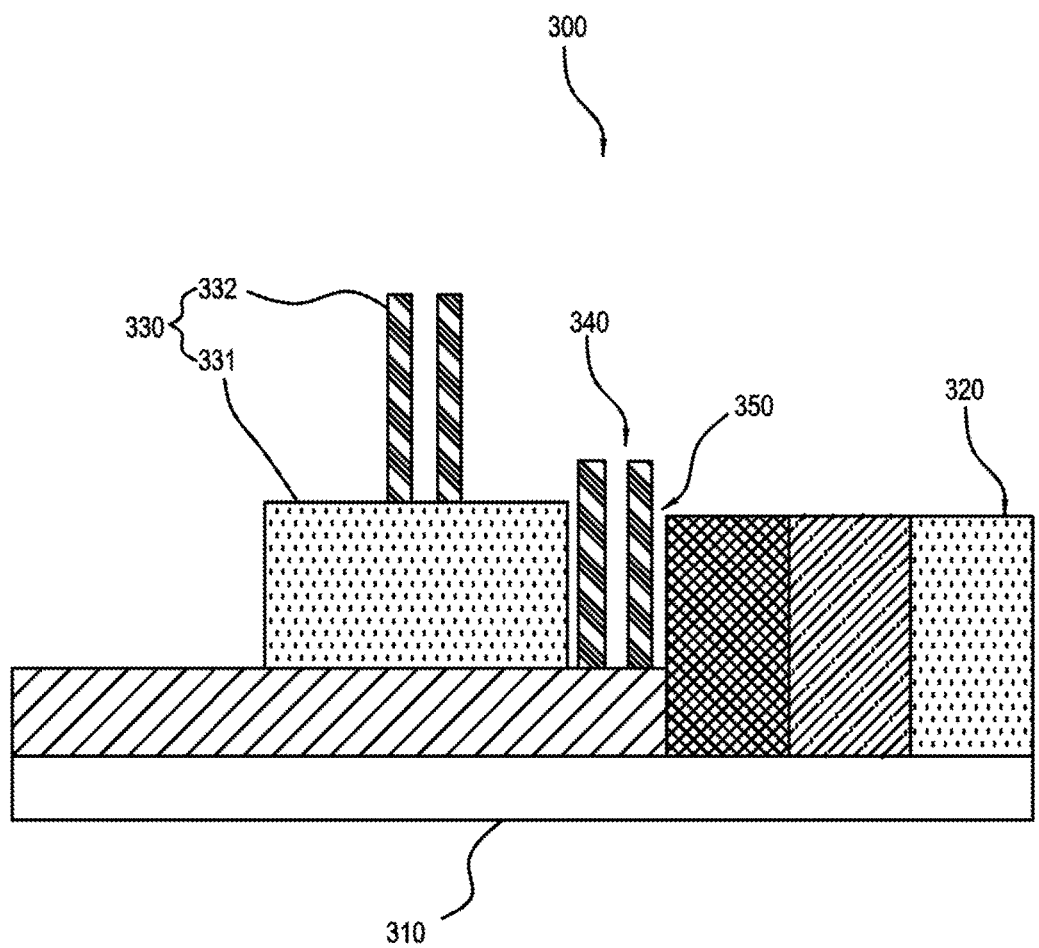
FIG. 2b is a cross-sectional view taken from a part of the FIG. 2a showing the retaining wall structure and the flow guiding structure of an array substrate of an embodiment of the present invention.

FIG. 2a is a top view showing a retaining wall structure and a flow guiding structure of an array substrate according to an embodiment of the present invention, and FIG. 2b is a cross-sectional view taken from a part of the FIG. 2a showing the retaining wall structure and the flow guiding structure of an array substrate of an embodiment of the present invention.

Referring to FIGS. 2a and 2b, in one embodiment of the present invention, an array substrate 300 comprises a substrate 310, a switch array structure 320 disposed on the substrate, a retaining wall structure 330 disposed on a peripheral region of the substrate 310 and surrounding the switch array structure 320, and a flow guiding structure 340 disposed on an area surrounding the peripheral region between the switch array structure 320 and the retaining wall structure 330. In addition, the flow guiding structure 340 has a height different from a height of the retaining wall structure 330.

Figure 2C:
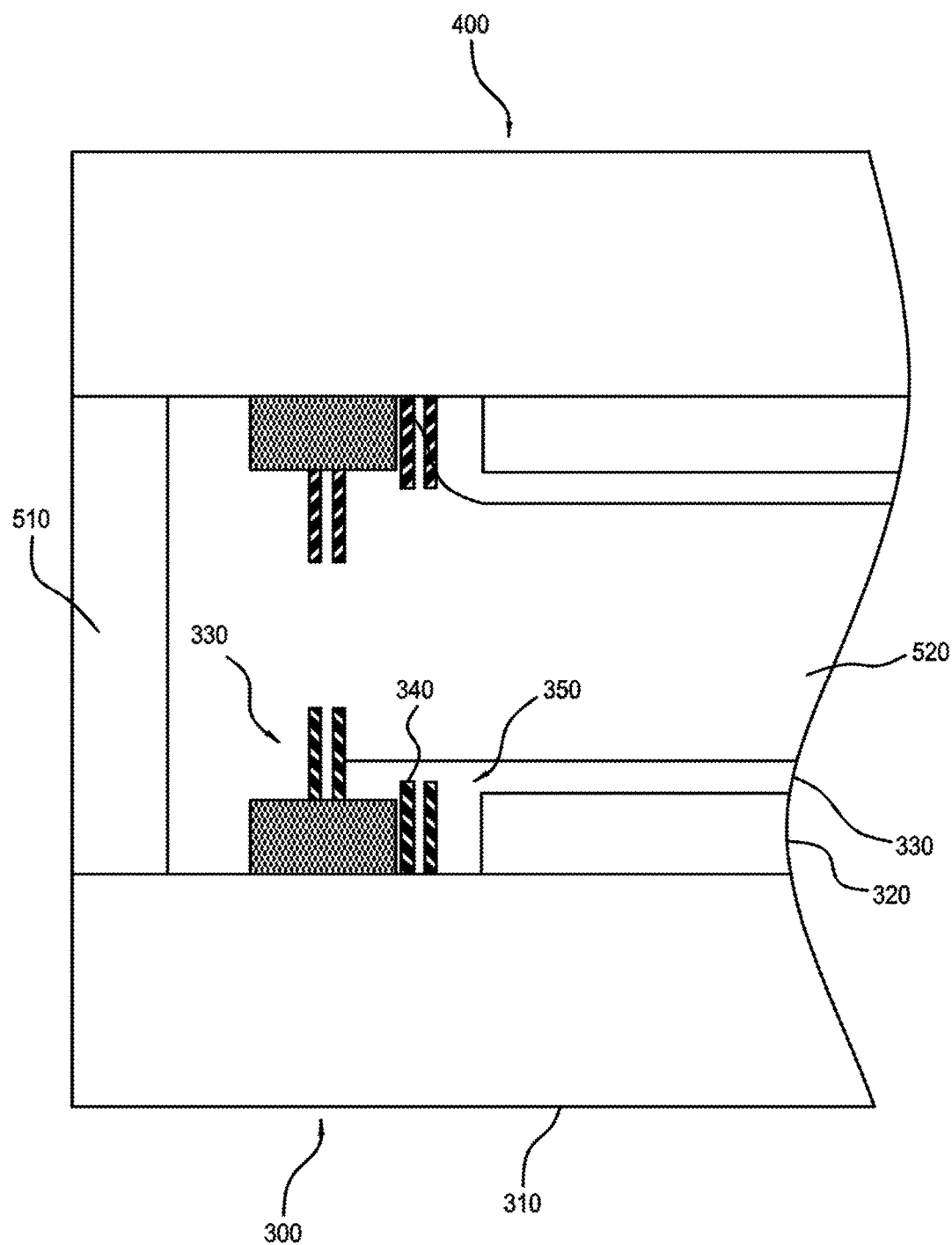
FIG. 2c is a cross-sectional view showing a liquid crystal display panel according to an embodiment of the present invention.

FIG. 2c is a cross-sectional view showing a liquid crystal display panel according to an embodiment of the present invention. Referring to FIG. 2c, in conjunction with FIGS. 2a and 2b, in one embodiment of the present invention, a display panel includes an array substrate 300, an opposing substrate 400, a liquid crystal layer 520 and a sealing member 510.

The array substrate 300 comprises a substrate 310, a switch array structure 320 disposed on the substrate 310, a retaining wall structure 330 disposed on a peripheral region of the substrate 310 and surrounding the switch array structure 320, and a flow guiding structure 340 disposed on an area surrounding the peripheral region between the switch array structure 320 and the retaining wall structure 330. In addition, the flow guiding structure 340 has a height different from a height of the retaining wall structure 330. Furthermore, the opposing substrate 400 is disposed in parallel with the array substrate 300, the liquid crystal layer 520 is interposed between the array substrate 300 and the opposing substrate 400, and the sealing member 510 is disposed on the array substrate 300 corresponding to the location surrounding the periphery of the liquid crystal layer 520 and seals the array substrate 300 and the opposing substrate 400.

In one embodiment of the present invention, a groove 350 is formed between the retaining wall structure 330 and the switch array structure 320, and the flow guiding structure 340 is disposed in the groove 350.

In one embodiment of the present invention, a width of the groove 350 is substantially the same, or different, or partially the same.

In one embodiment of the present invention, a depth of the groove 350 is substantially the same, or different, or partially the same.

In one embodiment of the present invention, the depth of the groove 350 is in a range of 0.4 µm to 1.6 µm.

In one embodiment of the present invention, the flow guiding structure 340 comprises a plurality of dummy photo spaced walls 332 and a plurality of openings, and each of the plurality of dummy photo spaced walls 332 and each of the plurality of openings are arranged in alternate.

In one embodiment of the present invention, a plurality of isolating layers are formed by the composition of the plurality of dummy photo spaced walls 332 and the plurality of openings.

In one embodiment of the present invention, in the two adjacent isolating layers, wherein the opening of one of the isolating layers and the dummy photo spaced walls 332 of the other isolating layer are arranged in alternate.

In one embodiment of the present invention, a width of each of the plurality of dummy photo spaced walls is substantially the same, or different, or partially the same.

In one embodiment of the present invention, a width of each of the plurality of dummy photo spaced walls is in a range of 10 µm to 300 µm.

In one embodiment of the present invention, a height of each of the plurality of dummy photo spaced walls is substantially the same, or different, or partially the same.

In one embodiment of the present invention, a height of each of the plurality of dummy photo spaced walls is in a range of 2 µm to 5 µm.

In one embodiment of the present invention, a thickness of each of the plurality of dummy photo spaced walls is substantially the same, or different, or partially the same.

In one embodiment of the present invention, a thickness of each of the plurality of dummy photo spaced walls is in a range of 0.3 µm to 5 µm.

In one embodiment of the present invention, a width of each of the plurality of openings is substantially the same, or different, or partially the same.

In one embodiment of the present invention, a length of each of the plurality of dummy photo spaced walls in the same isolating layer is substantially the same.

In one embodiment of the present invention, the center part of the array substrate 300 is an effective display region, the length of the plurality of dummy photo spaced walls in each of the isolating layers is gradually increased in the direction from the effective display region to the sealing member 510.

In one embodiment of the present invention, a width of each of the plurality of openings in the same isolating layer is substantially the same.

In one embodiment of the present invention, the width of openings in each of the isolating layers is gradually decreased in the direction from the effective display region to the sealing member 510.

In one embodiment of the present invention, the adjacent two openings of the same isolating layer have two widths, and the openings of the two widths are alternately arranged.

In one embodiment of the present invention, the adjacent two dummy photo spaced walls 332 of the same isolating layer have two lengths, and the dummy photo spaced walls 332 of the two lengths are alternately arranged.

In one embodiment of the present invention, the flow guiding structure 340 comprises a plurality of dummy photo spaced walls 332, a cross sectional shape of each of the plurality of dummy photo spaced walls 332 parallel to the substrate is a straight line segment, a semicircle, a semi-elliptical arc, a concave, a circle, an ellipse or any combination of the semi-elliptical arc, the concave, the circle and the ellipse.

In one embodiment of the present invention, the flow guiding structure 340 comprises a plurality of dummy photo spaced walls 332, the material of the dummy photo spaced walls is a metal, a color barrier, a resin, an oxide, or an organic material.

In one embodiment of the present invention, the switch array structure 320 includes a thin film transistor array or a color filter array, the array substrate 300 is a thin film transistor array substrate 300 or a color filter substrate.

In one embodiment of the present invention, the retaining structure 330 includes at least one of a plurality of dummy photo spaced walls 332 and a non-display area colored resist blocking wall 331.

In one embodiment of the present invention, the materials for the non-display area colored resist blocking wall may be composed of red colored resist material, blue colored resist material and green colored resist material.

In one embodiment of the present invention, a plurality of dummy photo spaced walls 332 are formed on the non-display area colored resist blocking wall 331, a plurality of isolating layers are formed by the plurality of dummy photo spaced walls.

In one embodiment of the present invention, the array substrate 300 is a thin film transistor array substrate, the flow guiding structure 340 is formed on the thin film transistor array substrate and composed of a metal thin film, an inorganic insulating film, a transparent conducting thin film, a semiconductor thin film, or a combination of one or some of the metal thin film, the inorganic insulating film, the transparent conducting thin film, and the semiconductor thin film.

In one embodiment of the present invention, the array substrate 300 is a color filter substrate, the flow guiding structure 340 is formed on the color filter substrate and composed of a color thin film, a protective thin film, a black matrix thin film, a transparent conductive thin film, or a combination of one or some of the color thin film, the protective thin film, the black matrix thin film, the transparent conductive thin film.

In one embodiment of the present invention, the array substrate 300 is a color filter substrate, the retaining wall structure 330 is formed on the color filter substrate, and the retaining wall structure is formed by the same material as one of a plurality of colored resist materials used in the color filter layer forming on the color filter substrate.

In one embodiment of the present invention, the flow guiding structure 340 and the non-display area colored resist blocking wall 331 having a plurality of dummy photo spaced walls 332 disposed thereon, the plurality of dummy photo spaced walls 332 form a plurality of isolating layers, and the number of the isolating layers provided on the flow guiding structure 340 and the non-display area colored resist blocking wall may be the same or different.

Figure 2D:
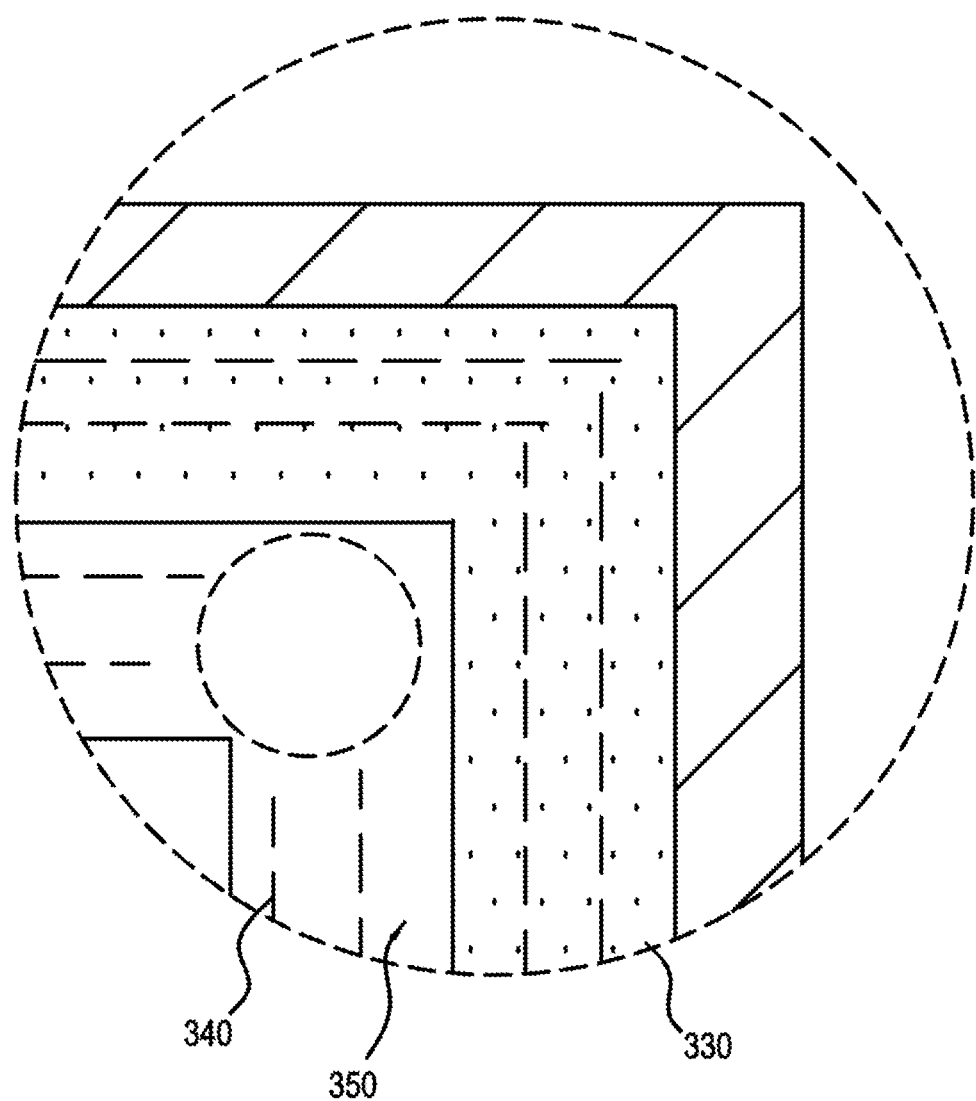
FIG. 2d is a partial enlarged schematic view showing a retaining wall structure and a flow guiding structure of the array substrate of an embodiment of the present invention.

FIG. 2d is a partial enlarged schematic view showing a retaining wall structure 330 and a flow guiding structure 340 of the array substrate 300 of an embodiment of the present invention. Referring to FIG. 2d, in conjunction with FIGS. 2a and 2b, the flow guiding structure 340 includes a plurality of dummy photo spaced walls 332, a buffer region is formed at the region adjacent to the included angle between two adjacent edges of the switch array structure 320. In addition, the dummy photo spaced walls 332 are not arranged in the buffer region.

Under the consideration of substantially not to alter the existing production process, the structure design of the display panel of the present invention is possible to avoid the problem regarding accumulation of the alignment layer forming solution at the plurality of dummy photo spaced walls 332 causing by the poor fluidity, and thereby to avoid the problem of the cell gaps too height at the peripheral region of the switch array structure 320 compared with the central part of that. Furthermore, the technology provided by the invention can be used for manufacturing various types of liquid crystal display panel, and is high in applicability.

In addition, in the specification, unless explicitly described to the contrary, the word "comprise" and variations such as "comprises" or "comprising" will be understood to imply the inclusion of stated elements but not the exclusion of any other elements.

The present invention has been described with a preferred embodiment thereof and it is understood that many changes and modifications to the described embodiment can be carried out without departing from the scope and the spirit of the invention that is intended to be limited only by the appended claims.

What is claimed is:

1. An array substrate, comprising:
a substrate;
a switch array structure, disposed on the substrate;
a retaining wall structure, disposed on a peripheral region of the substrate and surrounding the switch array structure; and
a flow guiding structure, disposed on an area surrounding the peripheral region between the switch array structure and the retaining wall structure and having a height different from a height of the retaining wall structure.

2. The array substrate according to claim 1, further comprising a groove formed between the retaining wall structure and the switch array structure, for enabling the flow guiding structure to be disposed therein.

3. The array substrate according to claim 1, wherein the flow guiding structure comprises a plurality of dummy photo spaced walls and a plurality of openings, and each of the plurality of dummy photo spaced walls and each of the plurality of openings are arranged in alternate.

4. The array substrate according to claim 1, wherein the flow guiding structure comprises a plurality of dummy photo spaced walls disposed on the area surrounding the peripheral region between the switch array structure and the retaining wall structure other than the regions adjacent to an included angle between two adjacent edges of the switch array structure.

5. The array substrate according to claim 1, wherein the flow guiding structure comprises a plurality of dummy photo spaced walls, a width of each of the plurality of dummy photo spaced walls is substantially the same, or different, or partially the same, a height of each of the plurality of dummy photo spaced walls is substantially the same, or different, or partially the same, a thickness of each of the plurality of dummy photo spaced walls is substantially the same, or different, or partially the same, a plurality of openings is formed between the plurality of dummy photo spaced walls arranged in alternate, a width of each of the plurality of openings is substantially the same, or different, or partially the same.

6. The array substrate according to claim 1, wherein the flow guiding structure comprises a plurality of dummy photo spaced walls, a cross sectional shape of each of the plurality of dummy photo spaced walls parallel to the substrate is a straight line segment, a semicircle, a semi-elliptical arc, a concave, a circle, an ellipse or any combination of the semi-elliptical arc, the concave, the circle and the ellipse.

7. The array substrate according to claim 1, wherein the array substrate is a thin film transistor array substrate, the flow guiding structure is formed on the thin film transistor array substrate and composed of a metal thin film, an inorganic insulating film, a transparent conducting thin film, a semiconductor thin film, or a combination of one or some of the metal thin film, the inorganic insulating film, the transparent conducting thin film, and the semiconductor thin film.

8. The array substrate according to claim 1, wherein the array substrate is a color filter substrate, the flow guiding structure is formed on the color filter substrate and composed of a color thin film, a protective thin film, a black matrix thin film, a transparent conductive thin film, or a combination of one or some of the color thin film, the protective thin film, the black matrix thin film, and the transparent conductive thin film.

9. The array substrate according to claim 1, wherein the array substrate is a color filter substrate, the retaining wall structure is formed on the color filter substrate.

10. The array substrate according to claim 9, wherein the retaining wall structure is formed by the same material as one of a plurality of colored resist materials used in the color filter layer forming on the color filter substrate.

11. A display panel, comprising:
an opposing substrate; and
an array substrate, comprising:
a substrate;
a switch array structure, disposed on the substrate;
a retaining wall structure, disposed on a peripheral region of the substrate and surrounding the switch array structure; and
a flow guiding structure, disposed on an area surrounding the peripheral region between the switch array structure and the retaining wall structure and having a height different from a height of the retaining wall structure.

12. The display panel according to claim 11, further comprising a groove formed between the retaining wall structure and the switch array structure, for enabling the flow guiding structure to be disposed therein.

13. The display panel according to claim 11, wherein the flow guiding structure comprises a plurality of dummy photo spaced walls and a plurality of openings, and each of the plurality of dummy photo spaced walls and each of the plurality of openings are arranged in alternate.

14. The display panel according to claim 11, wherein the flow guiding structure comprises a plurality of dummy photo spaced walls disposed on the area surrounding the peripheral region between the switch array structure and the retaining wall structure other than the regions adjacent to an included angle between two adjacent edges of the switch array structure.

15. The display panel according to claim 11, wherein the flow guiding structure comprises a plurality of dummy photo spaced walls, a width of each of the plurality of dummy photo spaced walls is substantially the same, or different, or partially the same, a height of each of the plurality of dummy photo spaced walls is substantially the same, or different, or partially the same, a thickness of each of the plurality of dummy photo spaced walls is substantially the same, or different, or partially the same, a plurality of openings is formed between the plurality of dummy photo spaced walls arranged in alternate, a width of each of the plurality of openings is substantially the same, or different, or partially the same.

16. The display panel according to claim 11, wherein the flow guiding structure comprises a plurality of dummy photo spaced walls, a cross sectional shape of each of the plurality of dummy photo spaced walls parallel to the substrate is a straight line segment, a semicircle, a semi-elliptical arc, a concave, a circle, an ellipse or any combination of the semi-elliptical arc, the concave, the circle and the ellipse.

17. The display panel according to claim 11, wherein the array substrate is a thin film transistor array substrate, the flow guiding structure is formed on the thin film transistor array substrate and composed of a metal thin film, an inorganic insulating film, a transparent conducting thin film, a semiconductor thin film, or a combination of one or some of the metal thin film, the inorganic insulating film, the transparent conducting thin film, and the semiconductor thin film.

18. The display panel according to claim 11, wherein the array substrate is a color filter substrate, the flow guiding structure is formed on the color filter substrate and composed of a color thin film, a protective thin film, a black matrix thin film, a transparent conductive thin film, or a combination of one or some of the color thin film, the protective thin film, the black matrix thin film, and the transparent conductive thin film.

19. The display panel according to claim 11, wherein the retaining wall structure is formed by the same material as one of a plurality of colored resist materials used in the color filter layer forming on the color filter substrate.

20. An array substrate, comprising:
a substrate;
a switch array structure, disposed on the substrate;
a retaining wall structure, disposed on a peripheral region of the substrate surrounding the switch array structure; and
a flow guiding structure, disposed on an area surrounding the peripheral region between the switch array structure and the retaining wall structure and having a height different from a height of the retaining wall structure;
wherein a groove is formed between the retaining wall structure and the switch array structure for enabling the flow guiding structure to be disposed therein, the flow guiding structure comprises a plurality of dummy photo spaced walls and a plurality of openings, and each of the plurality of dummy photo spaced walls and each of the plurality of openings are arranged in alternate, and the plurality of dummy photo spaced walls is disposed on the area surrounding the peripheral region between the switch array structure and the retaining wall structure other than the regions adjacent to an included angle between two adjacent edges of the switch array structure.

* * * * *